United States Patent
Schier et al.

(10) Patent No.: US 12,276,016 B2
(45) Date of Patent: Apr. 15, 2025

(54) COATED CUTTING TOOL

(71) Applicant: WALTER AG, Tubingen (DE)

(72) Inventors: Veit Schier, Tubingen (DE); Wolfgang Engelhart, Tubingen (DE)

(73) Assignee: WALTER AG, Tubingen (DE)

( * ) Notice: Subject to any disclaimer, the term of this patent is extended or adjusted under 35 U.S.C. 154(b) by 148 days.

(21) Appl. No.: 17/786,115

(22) PCT Filed: Dec. 17, 2020

(86) PCT No.: PCT/EP2020/086640
§ 371 (c)(1),
(2) Date: Jun. 16, 2022

(87) PCT Pub. No.: WO2021/122892
PCT Pub. Date: Jun. 24, 2021

(65) Prior Publication Data
US 2023/0028083 A1    Jan. 26, 2023

(30) Foreign Application Priority Data

Dec. 20, 2019 (EP) ..................... 19218808

(51) Int. Cl.
*C23C 30/00* (2006.01)
*C23C 14/00* (2006.01)
*C23C 14/06* (2006.01)
*C23C 14/34* (2006.01)
*C23C 14/35* (2006.01)

(52) U.S. Cl.
CPC ...... *C23C 14/0641* (2013.01); *C23C 14/0036* (2013.01); *C23C 14/3485* (2013.01); *C23C 14/352* (2013.01); *C23C 30/005* (2013.01)

(58) Field of Classification Search
CPC .................. C23C 14/0641; C23C 30/005
USPC ...................................... 428/698
See application file for complete search history.

(56) References Cited

U.S. PATENT DOCUMENTS

| | | |
|---|---|---|
| 2011/0081539 A1 | 4/2011 | Ni et al. |
| 2018/0030590 A1 | 2/2018 | Schier et al. |
| 2018/0223436 A1 | 8/2018 | Schier |

FOREIGN PATENT DOCUMENTS

| | | |
|---|---|---|
| WO | 2009035404 A1 | 3/2009 |
| WO | 2019043167 A1 | 3/2019 |

*Primary Examiner* — Katherine A Christy
(74) *Attorney, Agent, or Firm* — Corinne R. Gorski

(57) ABSTRACT

A coated cutting tool includes a substrate with a coating including a (Ti,Al)N layer having an overall composition $(Ti_xAl_{1-x})N$, $0.34 \leq x \leq 0.65$. The (Ti,Al)N layer contains columnar (Ti,Al)N grains with an average grain size of from 10 to 100 nm. The (Ti,Al)N layer also includes lattice planes of a cubic crystal structure. The (Ti,Al)N layer shows a pattern in electron diffraction analysis, wherein there is a diffraction signal existing, which is shown as a peak (P) in an averaged radial intensity distribution profile having its maximum within a scattering vector range of from 3.2 to 4.0 $nm^{-1}$, the full width half maximum (FWHM) of the peak (P) being from 0.8 to 2.0 $nm^{-1}$.

17 Claims, 5 Drawing Sheets

COATED CUTTING TOOL

RELATED APPLICATION DATA

This application is a § 371 National Stage Application of PCT International Application No. PCT/EP2020/086640 filed Dec. 17, 2020 claiming priority to EP 19218808.4 filed Dec. 20, 2019.

The present invention relates to a coated cutting tool having a coating comprising a (Ti,Al)N layer.

BACKGROUND

There is a continuous desire to improve cutting tools for metal machining so that they last longer, withstand higher cutting speeds and/or other increasingly demanding cutting operations.

Generally, cutting tools for metal machining comprises a substrate of a hard material such as cemented carbide, cubic boron nitride, or cermet, and a thin wear resistant coating deposited on the surface of the substrate.

The performance of the coating depends on a complex interaction of different factors, both physical and mechanical properties of the coating itself and the type of metal machining operation.

When depositing the wear resistant coating the general methods used are chemical vapour deposition (CVD) or physical vapour deposition (PVD). There are limitations on which coatings characteristics that are possible to provide by either method. Even when coatings of the same chemical composition are deposited with either method their properties will vary in terms of, for example, internal residual stress, density, and crystallinity.

The origin of a metal element in a coating deposited by a PVD method is a so called "target" in the PVD reactor. Various PVD methods exist, of which the main categories are cathodic arc evaporation and magnetron sputtering. Within the general term "magnetron sputtering" there furthermore exist different methods which differ a lot from each other, such as dual magnetron sputtering and High Power Impulse Magnetron Sputtering (HIPIMS). The coatings provided by using different methods will be different in various aspects. Also, different combinations of process parameters used within the same type of PVD method will lead to differences between the deposited coatings, such as different physical properties, different mechanical properties, different crystal structure and different behaviour when used in a metal cutting process.

Titanium aluminium nitride (Ti,Al)N coatings deposited by physical vapour deposition (PVD) are well-known. One type of (Ti,Al)N coating is a single-layer where the (Ti,Al)N composition is essentially the same throughout the layer. A single-layer coating is provided when the one or more targets used in the deposition process have the same Ti:Al ratio. Another type of (Ti,Al)N coating is a multilayer where there are (Ti,Al)N sublayers of different composition present in the layer. Such a multilayer can be provided when at least two of the targets used in the deposition process have different Ti:Al ratios so that when the substrate is rotated in the chamber sublayers of different composition are deposited in alternation. A special type of multilayer is a nano-multilayer where the individual layer thicknesses may be as low as only a few nanometers.

US 2018/0223436 A1 discloses a coated cutting tool having a cemented carbide substrate and a (Ti,Al)N coating. The coating comprises a single-layer or a multilayer anti-wear protective layer of, e.g., (Ti,Al)N deposited by a HIPIMS process.

US 2018/0030590 A1 discloses a $Ti_{0.40}Al_{0.60}N$ layer made by HIPIMS having long service life.

OBJECT OF INVENTION

The object of the present invention is to provide a coated cutting tool with improved flank wear in metal cutting, especially in the cutting of steel. Reduced flank wear leads to improved tool life over prior art cutting tools.

THE INVENTION

It has now been provided a coated cutting tool comprising a substrate with a coating comprising a (Ti,Al)N layer having an overall composition $(Ti_xAl_{1-x})N$, $0.34 \leq x \leq 0.65$, the (Ti,Al)N layer contains columnar (Ti,Al)N grains with an average grain size of from 10 to 100 nm, the (Ti,Al)N layer shows a pattern in electron diffraction analysis wherein there is a diffraction signal existing which is shown as a peak (P) in an averaged radial intensity distribution profile having its maximum within a scattering vector range of from 3.2 to 4.0 $nm^{-1}$, the full width half maximum (FWHM) of the peak (P) is from 0.8 to 2.0 $nm^{-1}$.

An averaged radial intensity profile is obtained from an electron diffraction pattern by providing an average of all intensities in the diffraction pattern with the same distance (radius) to the center of the diffraction pattern. Then, the averaged intensities are drawn as a function of the radius.

The (Ti,Al)N layer suitably has an overall composition $(Ti_xAl_{1-x})N$, $0.35 \leq x \leq 0.55$, preferably $0.36 \leq x \leq 0.45$.

The (Ti,Al)N layer preferably contains columnar grains with an average width of from 20 to 70 nm.

The peak (P) in an averaged radial intensity distribution profile has suitably its maximum within a scattering vector range of from 3.4 to 3.8 $nm^{-1}$.

The full width half maximum (FWHM) of the peak (P) is suitably from 1.0 to 1.8 $nm^{-1}$, preferably from 1.2 to 1.6 $nm^{-1}$.

In one embodiment, the (Ti,Al)N layer is a (Ti,Al)N nano-multilayer made of from 2 to 4, preferably 2, different (Ti,Al)N sub-layers having different Ti:Al ratios from each other. When the sub-layers are very thin there may not be a sharp boundary between two adjacent sub-layers of different Ti:Al ratio. Instead, there may be a gradual change in the Ti:Al ratio over the thickness of the (Ti,Al)N nano-multilayer in a periodic manner. Due to this the Ti:Al ratio of a sub-layer is herein considered to be the Ti:Al ratio present in the middle of a sub-layer.

The Ti:Al ratio of the sub-layer having the lowest Ti:Al ratio is suitably from 0.10:0.90 to 0.50:0.50, preferably from 0.25:0.75 to 0.40:0.60.

The Ti:Al ratio of the sub-layer having the highest Ti:Al ratio is suitably from 0.30:0.70 to 0.70:0.30, preferably from 0.35:0.65 to 0.50:0.50.

The average thicknesses of the different types of (Ti,Al)N sub-layers are suitably from 1 to 20 nm, preferably from 1.5 to 10 nm, most preferably from 1.5 to 5 nm.

The thickness of the (Ti,Al)N layer is suitably from 0.4 to 20 μm, preferably from 1 to 10 μm, most preferably from 2 to 6 μm.

By "grain size" of the (Ti,Al)N grains is herein meant the average grain width of the columnar (Ti,Al)N grains in the (Ti,Al)N layer. The grain width is measured in a direction parallel to the coating surface in the middle of the layer. In one embodiment the average grain size of the (Ti,Al)N grains is from 10 to 80 nm, preferably from 30 to 60 nm.

In one embodiment, the (Ti,Al)N layer has a thermal conductivity of from 2.5 to 4.0 W/mK, preferably from 3.0 to 3.6 W/mK. The low thermal conductivity is beneficial to keep the thermal load from the cutting process on the tool substrate as low as possible.

In one embodiment, the (Ti,Al)N layer has a Vickers hardness of from 2600 to 3700 HV 0.0015.

In one embodiment, the (Ti,Al)N layer has a reduced Young's modulus of from 350 to 470 GPa.

The thickness of the coating as a whole is suitably from 1 to 25 µm, preferably from 2 to 15 µm, most preferably from 3 to 10 µm.

The position of the maximum of the peak (P) in an averaged radial intensity distribution profile in the electron diffraction analysis can be regarded as resulting from a diffraction signal of a lattice d-spacing present in a crystal phase. Thus, the position of the maximum of the peak (P) within a scattering vector range of from 3.2 to 4.0 nm$^{-1}$ will then correlate to d-spacings of from 2.5 to 3.1 Å. The position of the maximum of the peak (P) within a scattering vector range of from 3.4 to 3.8 nm$^{-1}$ will then correlate to d-spacings of from 2.6 to 2.9 Å. Since there are no d-spacings possible in a cubic structure greater than about 2.34 Å the diffraction signal giving the peak (P) is in one embodiment regarded to result from a lattice plane of a hexagonal crystal structure, preferably the (100) lattice plane.

The broadness of the peak (P) implies that the size of the crystal phase domains, or crystallites, are very small.

In one embodiment there is a grain boundary phase present between (Ti,Al)N grains in the (Ti,Al)N layer. The grain boundary phase can be seen in TEM analysis as a very thin contrasting phase situated between individual (Ti,Al)N grains. The grain boundary phase suitably comprises a hexagonal crystal structure. The grain boundary phase suitably has an average thickness of from 1 to 5 nm, preferably from 1 to 3 nm.

In one embodiment the (Ti,Al)N layer shows a pattern in electron diffraction analysis which comprises diffraction signals from lattice planes of a cubic crystal structure.

In one embodiment the diffraction signals from lattice planes of a cubic crystal structure have an FWHM of ≤0.5 nm$^{-1}$, suitably from 0.10 to 0.4 nm$^{-1}$, preferably from 0.12 to 0.30 nm$^{-1}$. The lattice planes of a cubic crystal structure giving diffraction signals are at least one of (111), (200), (220) and (222), suitably at least (111) and (200), preferably at least (111), (200) and (220), most preferably (111), (200), (220) and (222).

In one embodiment, there are cubic (111) lattice planes present in the (Ti,Al)N layer, the (111) lattice planes have a preferred orientation within 40 degrees+/−15 degrees, from a direction perpendicular to the coating surface, preferably 40 degrees+/−10 degrees, from a direction perpendicular to the coating surface. By "preferred orientation" of a (hkl) lattice plane is herein meant the location of a maximum of frequency of the presence of a certain tilting of the (hkl) lattice planes among all (hkl) lattice planes. The preferred orientation of lattice planes can be determined by XRD texture analysis, in particular from pole figures.

The substrate of the coated cutting tool can be of any kind common in the field of cutting tools for metal machining. The substrate is suitably selected from cemented carbide, cermet, cBN, ceramics, PCD and HSS.

In one preferred embodiment, the substrate is cemented carbide.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid tool such as a solid drill, an endmill, or a tap.

The (Ti,Al)N layer is preferably deposited by High Power Impulse Magnetron Sputtering (HIPIMS).

In one embodiment the coating comprises a layer of a metal nitride immediately below the (Ti,Al)N layer. The metal nitride is suitably a nitride of one or more metals belonging to group 4 to 6 in the IUPAC periodic table of elements, optionally together with Al and/or Si. Examples of such metal nitrides are TiN and (Ti,Al)N. The thickness of the metal nitride layer is suitably from 0.5 to 5 µm, preferably from 1 to 3 µm. This metal nitride layer is preferably deposited by HIPIMS.

In one embodiment, the layer of a metal nitride immediately below the (Ti,Al)N layer is a single-layer of $(Ti_yAl_{1-y})N$, 0.30≤y≤0.90, preferably 0.33≤y≤0.70.

In a preferred embodiment, the coated cutting tool comprises a substrate with a coating comprising a from 1 to 10 µm thick (Ti,Al)N layer having an overall composition $(Ti_xAl_{1-x})N$, 0.34≤x≤0.65, the (Ti,Al)N layer contains columnar (Ti,Al)N grains with an average grain size of from 10 to 100 nm, the (Ti,Al)N layer shows a pattern in electron diffraction analysis wherein there is a diffraction signal existing which is shown as a peak (P) in an averaged radial intensity distribution profile having its maximum within a scattering vector range of from 3.2 to 4.0 nm$^{-1}$, the full width half maximum (FWHM) of the peak (P) is from 0.8 to 2.0 nm$^{-1}$, the (Ti,Al)N layer is a (Ti,Al)N nano-multilayer made of from 2 to 4 different (Ti,Al)N sub-layers having different Ti:Al ratios from each other, the Ti:Al ratio of the sub-layer having the lowest Ti:Al ratio is from 0.25:0.75 to 0.40:0.60 and the Ti:Al ratio of the sub-layer having the highest Ti:Al ratio is from 0.35:0.65 to 0.50:0.50, the average thicknesses of the different types of (Ti,Al)N sub-layers are from 1.5 to 5 nm.

DETAILED DESCRIPTION OF EMBODIMENTS IN DRAWINGS

Figure 1:
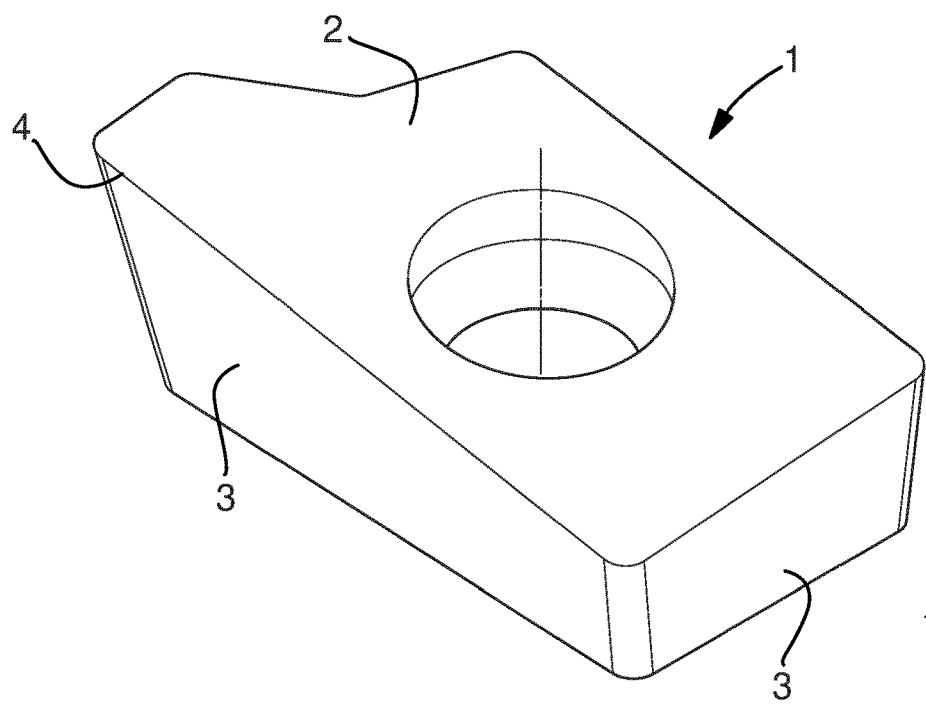
FIG. 1 shows a schematic view of one embodiment of a cutting tool being a milling insert.
Figure 6:
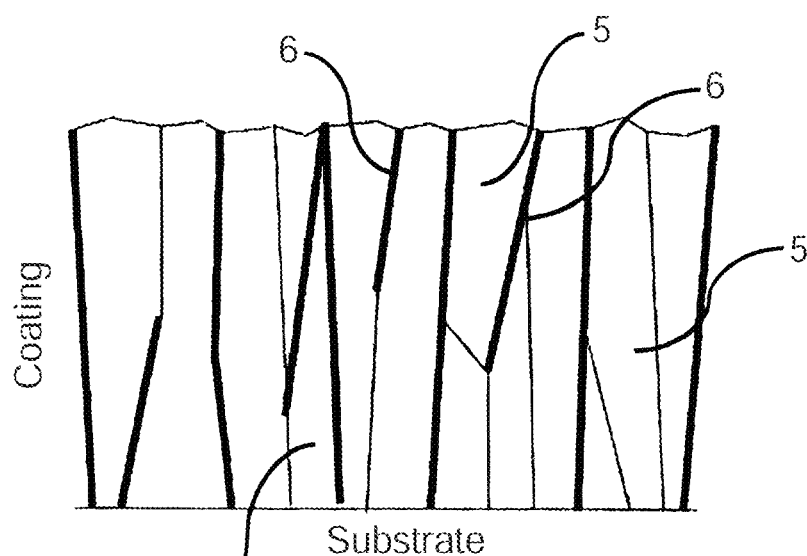
FIG. 6 shows a schematic illustration of a grain structure with a grain boundary phase present in some of the grain boundaries.
Figure 7:
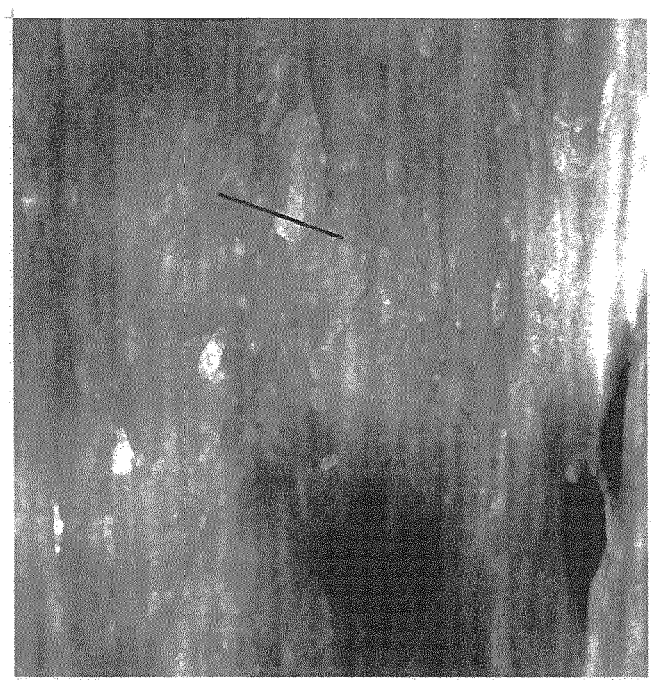
FIG. 7 shows a TEM image of a (Ti,Al)N layer according to the invention with a line drawn over several grains.
Figure 8:
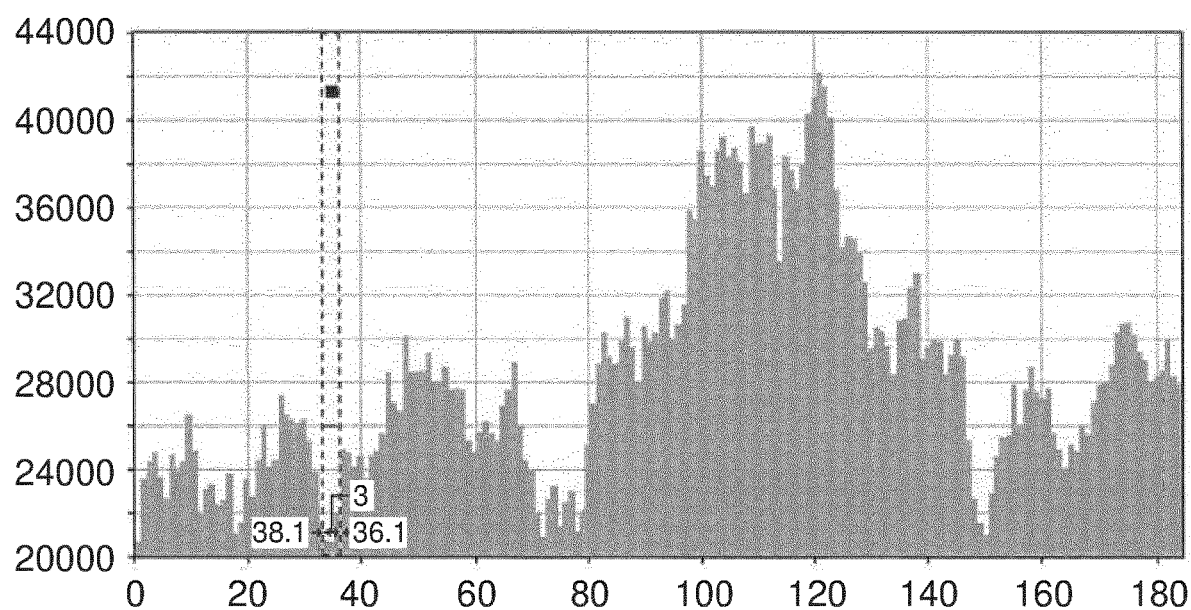
FIG. 8 shows an intensity profile for the line drawn in FIG. 7.
Figure 9:
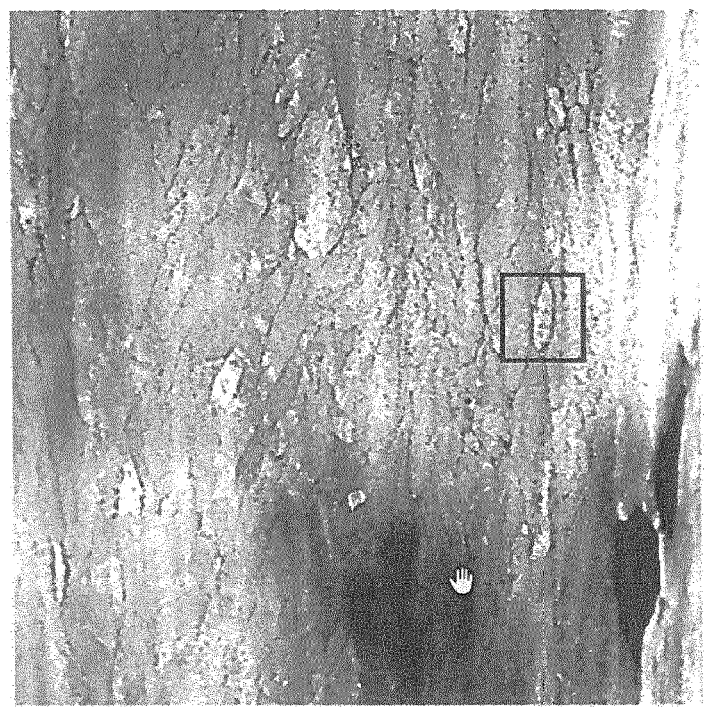
FIG. 9 shows a TEM image of a (Ti,Al)N layer according to the invention showing (Ti,Al)N grains.
Figure 10:
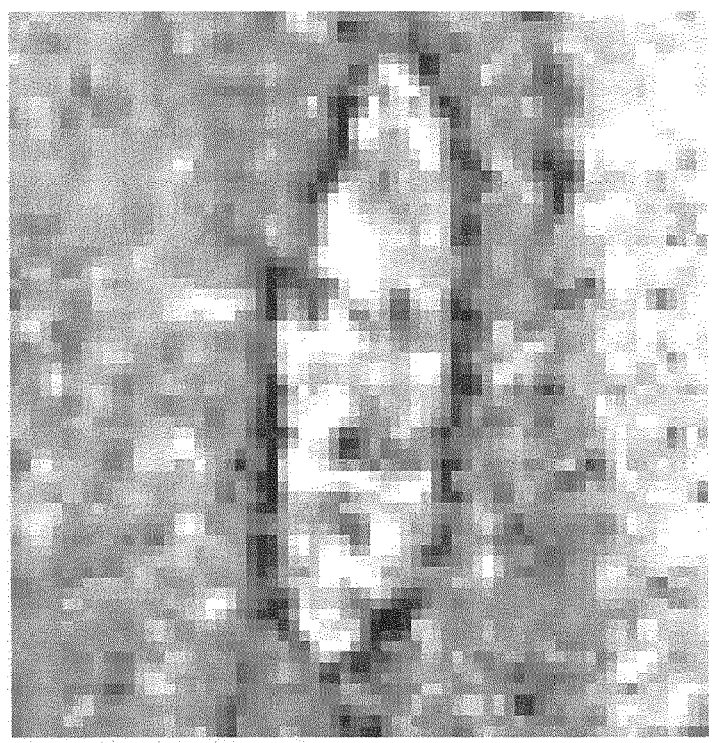
FIG. 10 shows an enlarged part of FIG. 9 showing a (Ti,Al)N grain surrounded by a grain boundary phase shown in black colour.

Embodiments of the invention are further described in the appended drawings FIG. 1, FIG. 6, FIG. 7 and FIG. 9. FIG. 1 shows a schematic view of one embodiment of a cutting tool (1) having a rake face (2) and flank faces (3) and a cutting edge (4). The cutting tool (1) is in this embodiment a milling insert. FIG. 6 shows a schematic illustration of a grain structure of a (Ti,Al)N layer according to the invention having (Ti,Al)N grains (5) with a grain boundary phase (6) present in some of the grain boundaries between adjacent (Ti,Al)N grains (5). FIG. 7 shows a TEM image of a (Ti,Al)N layer according to the invention with a line drawn over several grains. The intensity profile for the drawn line is shown in FIG. 8. The grain boundaries comprise a phase which is dark on the image so there is a significant drop in intensity over these grain boundaries. The thickness of the grain boundary phase can thereby be estimated. FIG. 9 shows the same TEM image as in FIG. 7 but with increased contrast so that the grain boundary phase is more clearly seen. A part of the figure is marked around one (Ti,Al)N grain. FIG. 10 shows an enlarged part of the marked part around one (Ti,Al)N grain in FIG. 9. The grain boundary phase in black is clearly seen around the (Ti,Al)N grain.

Methods

XRD Texture Analysis (Pole Figures)

For the analysis of the crystallographic texture, in order to determine the preferred orientation of lattice planes in the (Ti,Al)N layer, a diffractometer from Seifert/GE (PTS 3003) was used. $CuK_{alpha}$-radiation with a polycapillary lens (for producing a parallel beam) was applied for the analysis (high tension 40 kV, current 40 mA). The incident beam was defined by a 2 mm pinhole. For the diffracted beam path an energy dispersive detector (Meteor OD) was used. Pole figures were obtained from measurements which were done by tilting the alpha axis from 0-80° with a step size of 5° and by tilting the beta axis from 0-360° with a step size of 5°.

TEM-Analysis

The Transmission Electron Microscopy data (selected area diffraction patterns and dark field images) was acquired by a Transmission Electron Microscope from JEOL (Jeol ARM). For the analysis, a high tension of 300 kV was used.

When reference is made herein to electron diffraction experiments these are TEM measurements which were carried out with parallel illumination. The area of interest was selected with a selected area aperture.

For TEM sample preparation a FIB (Focused Ion Beam) Lift out was used. For the final polishing the Ga-Ion beam was adjusted to a current of 200 pA at 5 kV.

A cross-section of the coating was analysed perpendicular to surface of the coating.

Small intensities in the diffraction pattern can be resolved by using intensity profile analysis. From an averaged radial intensity distribution profile a Gauss fitting of the overall curve was made in order to extract the individual diffraction intensity peaks. The software used was HighScore version 4.8 from Malvern Panalytical.

For analysing the element distribution throughout a layer, e.g., in order to get the Ti:Al ratio at a specific position in the layer, TEM EDS linescan is preferably used using STEM Mode, 300 kV.

Analysis of thickness of the grain boundary phase was made by image analysis by determining the variation in brightness of the TEM image along an intersecting line. Since the grain boundary phase is dark in the image the thickness can be determined. A sufficient length of and/or number of intersecting lines is/are drawn so to provide a reliable average value of the grain boundary phase thickness. Suitably, at least 20 grain boundaries are intersected and an average value is calculated.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each and the holding time (creep time) was 10 seconds. From this curve hardness was calculated.

Reduced Young's Modulus

The reduced Young's modulus (reduced modulus of elasticity) was determined by means of nano-indentation (load-depth graph) as described for determining the Vickers hardness.

Fracture Toughness

The following procedure was used. The coating is deposited on polished cemented carbide substrate (8 wt % Co) with a flat squared geometry and side lengths of 15 mm. The surface roughness is further reduced using a soft ops polishing. Then the sample is ultrasonic cleaned in ethanol and transferred to a FIB-SEM System. A protective platin layer is deposited using a precursor gas and Ga-Ions from the FIB. A circular disk with a hole is removed by using the FIB until one is below the substrate. The result is a micro-pillar (about 5 µm) free standing on the substrate.

The sample is then transferred into an indentation system. The tip of the indenter is aligned above the pillar. The load depth curve is acquired, and the onset of cracking is visible. Using a mathematical model, the values for the fracture toughness is calculated. See further M. Sebastiani, "Current Opinion in Solid State and Materials Science", vol. 19 (2015), issue 6, pp. 324-333.

Grain Size of (Ti,Al)N:

The method used was a line intersectioning method. The surface of a sample was polished using OPS suspension until a flat surface is provided. Then a moderate magnification was used (about 10000×).

At least one 1-2 µm long intensity profile of the image was taken and grain boundaries were seen as significant reductions in intensity. The average distance between two grain boundaries next to each other, i.e., the diameter of a columnar grain, was taken as the average grain size. The measurements were made about 1 mm away from the cutting edge on the rake side of a polished insert, in the middle of the thickness of the layer.

Thermal Conductivity:

The Time-Domain-Thermal Reflectance (TDTR)-Method was used which has the following characteristics:

1. A laser pulse (Pump) is used to heat the sample locally.
2. Depending on the thermal conductivity and heat capacity, the heat energy is transferred from the sample surface towards the substrate. The temperature on the surface decreases by time.
3. The part of the laser being reflected depends on the surface temperature. A second laser pulse (probe pulse) is used for measuring the temperature decrease on the surface.

4. By using a mathematical model the thermal conductivity can be calculated also using the heat capacity value of the sample. Reference is made to (D. G. Cahill, Rev. Sci. Instr. 75, 5119 (2004)).

Thickness:

The thickness of the coating layers was determined by calotte grinding. Thereby a steel ball was used having a diameter of 30 mm for grinding the dome shaped recess and further the ring diameters were measured, and the layer thicknesses were calculated therefrom. Measurements of the layer thickness on the rake face (RF) of the cutting tool were carried out at a distance of 2000 µm from the corner, and measurements on the flank face (FF) were carried out in the middle of the flank face.

EXAMPLES

Example 1 (Invention)

A layer of $Ti_{40}Al_{60}N$ was deposited onto a WC—Co based cutting insert substrate using HIPIMS mode in a 6-flange INGENIA S3p (Oerlikon Balzers) equipment.

The substrate had a composition of 12 wt % Co, 1.6 wt % (Ta,Nb)C and balance WC with a WC grain size, dWC, of about 0.8 µm. The geometry of the cutting insert was ADMT160608R-F56.

Six $Ti_{40}Al_{60}$ targets were used being circular with a diameter of 160 mm. An about 2 µm thick HIPIMS $Ti_{40}Al_{60}N$ monolayer was deposited using the following deposition parameters.

Total pressure: 0.59 Pa
Ar pressure: 0.43 Pa (the rest is filled up with $N_2$ until total pressure)
Bias DC voltage: −40V
Temperature: 430° C.
Power supply: 60 kW
Average power per target: 9.04 kW
Pulse on-time: 7.56 µs
Frequency: 20 Hz
repetitions: 1

Then, an about 1.8 µm wear resistant (Ti,Al)N layer having an average composition $Ti_{36}Al_{64}N$ was deposited by HIPIMS. Six targets were used being circular with a diameter of 160 mm, three $Ti_{33}Al_{67}$ targets and three $Ti_{40}Al_{60}N$ targets. The following deposition parameters were used:

Total pressure: 0.64 Pa (7 min) 0.61 Pa (52 min)
Ar pressure: 0.43 Pa (the rest is filled up with $N_2$ until total pressure)
Bias DC voltage: −40V
Temperature: 430° C.
Power supply: 60 kW
On time: Ti33Al67: 2.00 ms, Ti40Al60: 2.53 ms
Average power per target: Ti33Al67: 7.2 kW, Ti40Al60: 9.0 kW

Example 2 (Reference 1)

A comparative sample, "reference 1", according to prior art was made. A layer of $Ti_{40}Al_{60}N$ was deposited onto a WC—Co based cutting insert substrate using HIPIMS mode in a 6-flange INGENIA S3p (Oerlikon Balzers) equipment.

The substrate had a composition of 12 wt % Co, 1.6 wt % (Ta,Nb)C and balance WC with a WC grain size, dWC, of about 0.8 µm. The geometry of the cutting insert was ADMT160608R-F56.

Six $Ti_{40}Al_{60}$ targets were used being circular with a diameter of 160 mm. An about 4 µm thick HIPIMS $Ti_{40}Al_{60}N$ monolayer was deposited using the same deposition parameters as for the lower $Ti_{40}Al_{60}N$ monolayer in Example 1.

Example 3 (Reference 2)

A comparative sample, "reference 2", according to prior art was made. A coating comprising a multilayer of (Ti,Al)N, $Ti_{33}Al_{67}N/Ti_{50}Al_{50}N$, was deposited onto a WC—Co based cutting insert substrate using HIPIMS mode in a HTC1000 Hauzer equipment.

The substrate had a composition of 12 wt % Co, 1.6 wt % (Ta,Nb)C and balance WC with a WC grain size, dWC, of about 0.8 µm. The geometry of the cutting insert was ADMT160608R-F56.

The coating deposited was essentially the same as disclosed in Example 2 of US 2018/0223436 A1. The coating was deposited as follows:

At first a bonding layer was formed by depositions in two steps. A first part of the bonding layer consisting of an about 50 nm thick layer of a $Ti_{50}Al_{50}N$ was deposited in step 1 by arc evaporation.

Step 1:
Target TiAl (50:50), 63 mm diameter, reactor position 2
Deposition Parameters:
Duration 3 min
Vaporizer current: 75 A
Flow regulation: 3500 sccm N2
Bias DC voltage: 60 V Then, a second part of the bonding layer consisting of an about 0.2 µm thick (Ti,Al)N multilayer of alternating sublayers of $Ti_{33}Al_{67}N$ and $Ti_{50}Al_{50}N$, in total about 6 sublayers was deposited in step 2.

Step 2:
Target 1: TiAl (33:67), 63 mm diameter, reactor position 5. Target 2: TiAl (50:50), 63 mm diameter, reactor position 2 (opposite).
Deposition Parameters:
Duration 3 min
Vaporizer current: 75 A
Flow regulation: 3500 sccm N2
Bias DC voltage: 40 V Then, a wear resistant (Ti,Al)N multilayer was deposited by HIPIMS using the following deposition parameters:
Target size Hauzer: Rectangular 17 cm×83 cm×1 cm
Average power: 36 kW (18 kW per target)
Bias DC voltage: 100 V
Peak current: Target 1: 170 A, target 2: 170 A
Reactive gas: 180 sccm N2, pressure regulated, 0.53 Pa (500 sccm Ar)
Pulse file: 60
Temperature: 550° C.

The thickness of the wear resistant (Ti,Al)N multilayer deposited was 2.7 µm and consisted of about 760 alternating TiAlN individual sublayers.

Example 4 (Analysis)

TEM Analysis with Electron Diffraction Analysis:

Images of the (Ti,Al)N layers of samples from examples 1-3 were made in a transmission electron microscope (TEM). FIGS. 7 and 9 show, respectively, an image of a sample according to the invention where a grain boundary phase between (Ti,Al)N grains is seen around (Ti,Al)N grains. However, such a grain boundary phase was not seen in images of comparative samples "reference 1" and "reference 2". Image analysis of TEM images of the sample according to the invention show that the thickness of the grain boundary phase is about 2-3 nm.

Furthermore, electron diffraction analysis were in the TEM on a sample according to the invention made according to the procedure in Example 1 and a comparative sample "reference 2" made according to the procedure in Example 3.

Figure 2:
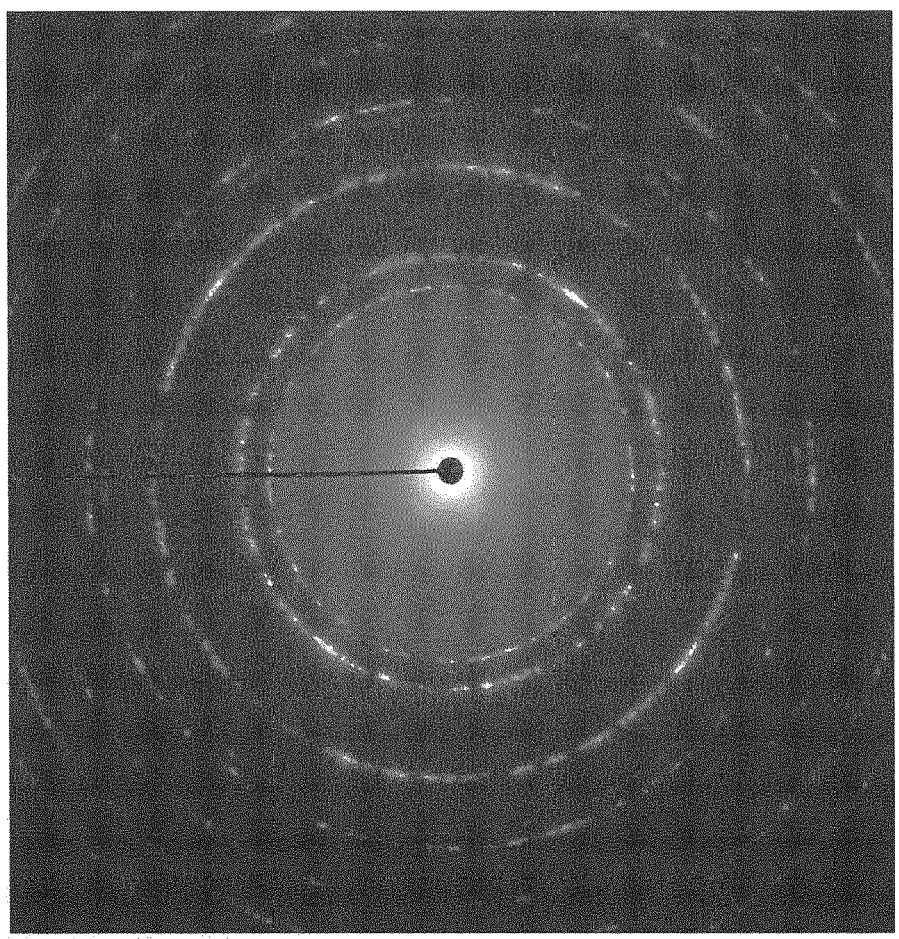
FIG. 2 shows an electron diffraction image of a (Ti,Al)N layer according to the invention.
Figure 3:
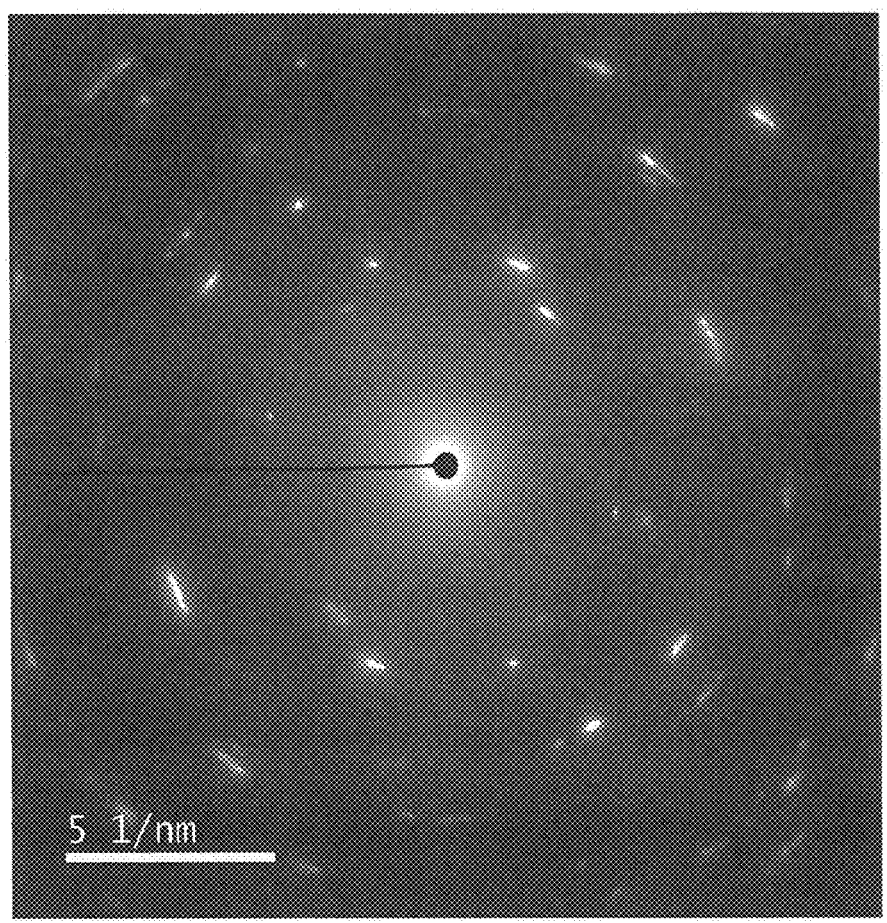
FIG. 3 shows an electron diffraction image of a (Ti,Al)N layer according to prior art.

FIGS. 2-3 show the electron diffraction patterns of the samples respectively.

Figure 4:
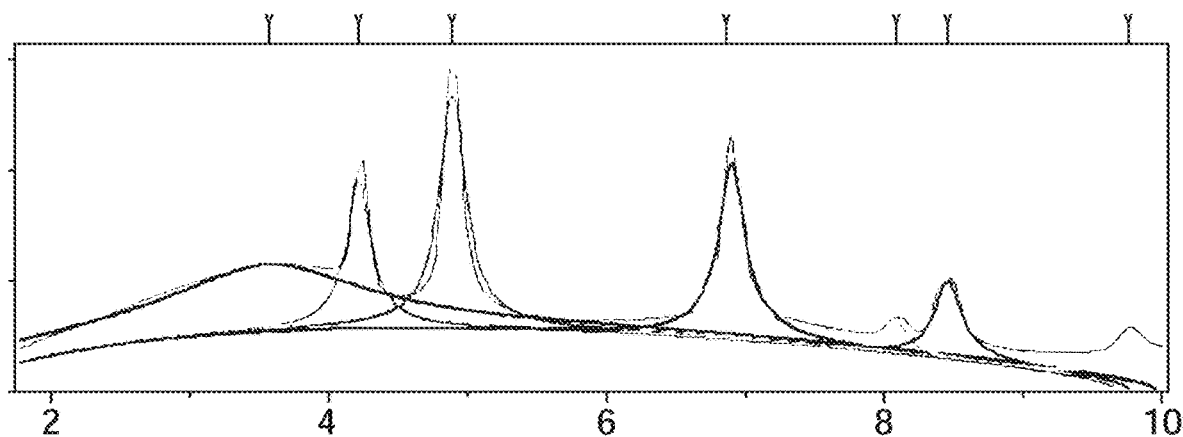
FIG. 4 shows a fitted average radial intensity distribution curves made for the electron diffractogram of the (Ti,Al)N layer according to the invention.

For the sample according to the invention it is clear from FIG. 2 that seen from a naked eye there are no very clear diffraction spots or even any ring-formed pattern visible for a scattering vector lower than about 4.1 $nm^{-1}$. However, FIG. 4 shows an average radial intensity distribution curve made for the electron diffractogram of the sample according to the invention. This curve shows the presence of a broad peak seen as a clear shoulder in the total intensity curve and after making a curve fitting (Gauss fit, removing the noise) the broad peak has its maximum at a scattering vector of about 3.6 $nm^{-1}$ (corresponding to a d-spacing of about 2.8 Å). The diffraction pattern further reveals six further signals up to a scattering vector of 10 $nm^{-1}$. See table 1 with corresponding d-spacings and FWHM values for the peaks. Furthermore, any close d-spacing from cubic crystal structure and hexagonal crystal structure from the standard TiAlN (TiN+AlN solid solution) diffraction pattern is put in the table.

TABLE 1

| Scattering vector ($nm^{-1}$) | d-spacing (Å) | FWHM ($nm^{-1}$) | Cubic d-spacing | Hexagonal d-spacing |
|---|---|---|---|---|
| 3.58 | 2.79 | 1.44 | — | 2.70, h-(100) |
| 4.22 | 2.37 | 0.16 | 2.34, c-(111) | 2.37, h-(101) |
| 4.89 | 2.04 | 0.18 | 2.02, c-(200) | — |
| 6.91 | 1.45 | 0.17 | 1.43, c-(220) | 1.41, h-(103) |
| 8.10 | 1.23 | 0.15 | 1.22, c-(311) | 1.24, h-(004?) |
| 8.46 | 1.18 | 0.18 | 1.17, c-(222) | 1.18, h-(202) |
| 9.77 | 1.02 | 0.18 | 1.01, c-(400) | 1.02, h-(210) |

The full width at half maximum (FWHM) of the peak is determined to be 1.44 $nm^{-1}$ and is a measure of the broadness of the peak.

Figure 5:
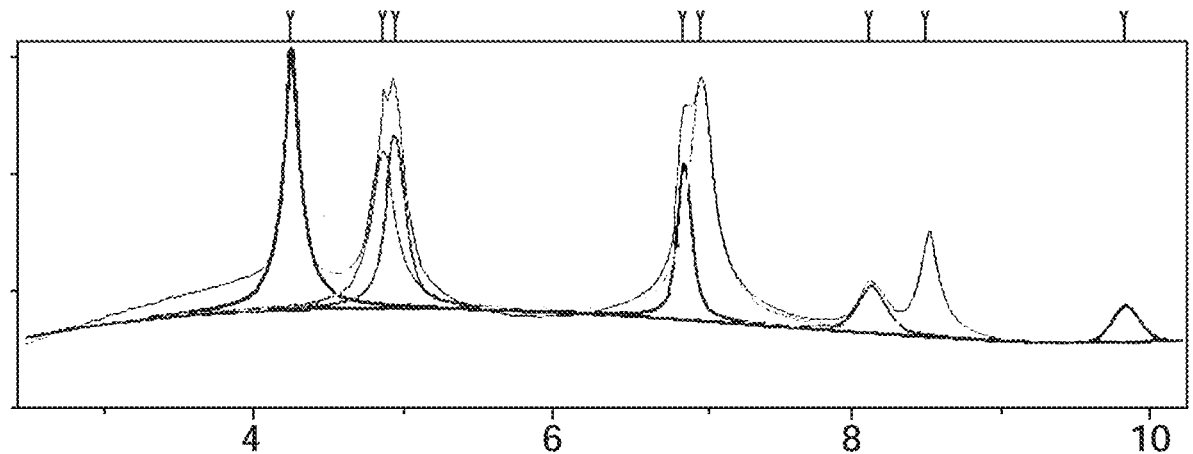
FIG. 5 shows a fitted average radial intensity distribution curves made for the electron diffractogram of a (Ti,Al)N layer according to prior art (ref. 2).

When an average radial intensity distribution curve is made for the electron diffractogram of the comparative sample "reference 2" there is no presence of any broad peak as seen for the sample according to the invention (see FIG. 5).

Without being bound to any theory, the origin of the broad peak at a low scattering vector in the sample according to the invention, as described above, is believed to be from a phase having very small structures. From TEM images one sees indications of a grain boundary phase in the (Ti,Al)N layer according to the invention but not in the (Ti,Al)N layer of neither reference 1, nor reference 2. The thickness of the grain boundary phase in the (Ti,Al)N layer according to the invention is estimated to be about 3 nm. The broadness of the peak is regarded to reflect the small size of the structures of this grain boundary phase.

XRD Analysis:

Retrievals of pole plots for the (111) lattice plane reflection were made for a sample according to the invention and the comparative sample "reference 2". The results showed that for the sample according to the invention there is a preferred orientation of the (111) lattice planes at about 40 degrees from a direction perpendicular to the coating surface. For the comparative sample there are two preferred orientations of the (111) lattice planes, one at about 15 degrees from a direction perpendicular to the coating surface and one at an angle of about 60 degrees from a direction perpendicular to the coating surface.

Grain Size:

From scanning electron microscopy (SEM) the grain size of the (Ti,Al)N grains were determined both for a sample according to the invention and the reference sample by line intersectioning. Table 2 shows the results.

TABLE 2

| Coating | Average grain size (column with) [nm] |
|---|---|
| Invention | 52 |
| Reference 2 | 140 |

Mechanical Properties:

Hardness measurements (load 15 mN) were also carried out on the flank face of the coated tool to determine Vickers hardness, reduced Young modulus (EIT) and fracture toughness ($K_{Ic}$). Table 3 shows the results. For characterization of toughness (Young's modulus) of the coatings, Vickers indents with a load of 500 mN were carried out and cross section prepared.

TABLE 3

| Coating | Hardness [HV0.0015] | EIT [GPa] | Fracture toughness, $K_{Ic}$ [$MPa*m^{0.5}$] |
|---|---|---|---|
| Invention | 3580 | 452 | 3.7 |
| Reference 1 | — | — | 3.3 |
| Reference 2 | 3882 | 502 | — |

Thermal Conductivity:

Finally, for the coating according to the invention the thermal conductivity was determined. The specific heat capacity value is needed and a value of 2.79 $J/cm^3K$ was used for the inventive coating and a value of 2.81 $J/cm^3K$ was used for reference 1. See table 4.

TABLE 4

| Coating | Specific heat capacity, Cp [$J/cm^3K$] | Thermal conductivity, λ [$W/m*K$] |
|---|---|---|
| Invention | 2.79 | 3.3 |
| Reference 1 | 2.81 | 4.7 |

Example 4 (Cutting Tests)

Milling tests were performed.
Workpiece material: Steel 42CrMo4 (ISO-P)
Tooth feed, fz [mm]: 0.2
Approach angle, κ [°]: 90
Cutting width, ae [mm]: 98
Cutting depth, ap [mm]: 3
Cutting speed, vc [m/min]: 185
Rotation, s [U/min]: 470

The criterion for terminating the cutting test was a flank wear of the tool of more than 0.1 μm. Table 5 shows the results.

TABLE 5

| Sample | Cutting length [mm] |
|---|---|
| Invention (Example 1) | 6400 |
| Reference 1 (Example 2) | 1600 |
| Reference 2 (Example 3) | 4800 |

It is concluded that the cutting tool comprising the (Ti,Al)N layer according to the invention has the best performance regarding flank wear which lead to longer tool life.

The invention claimed is:

1. A coated cutting tool comprising a substrate with a coating including a (Ti,Al)N layer having an overall composition $(Ti_xAl_{1-x})N$, $0.34 \leq x \leq 0.65$, wherein the (Ti,Al)N layer contains columnar (Ti,Al)N grains with an average grain size of from 10 to 100 nm, the (Ti,Al)N layer having lattice planes of a cubic crystal structure, wherein the (Ti,Al)N layer shows a pattern in electron diffraction analysis wherein there is a diffraction signal existing, which is shown as a peak in an averaged radial intensity distribution profile having its maximum within a scattering vector range of from 3.2 to 4.0 $nm^{-1}$, and a full width half maximum of the peak being from 0.8 to 2.0 $nm^{-1}$, wherein the (Ti,Al)N layer is a (Ti,Al)N nano-multilayer made of from 2 to 4 different (Ti,Al)N sub-layers having different Ti:Al ratios from each other, an average thickness of the 2 to 4 different (Ti,Al)N sub-layers being from 1 to 20 nm.

2. The coated cutting tool according to claim 1, wherein the (Ti,Al)N layer has an overall composition $(Ti_xAl_{1-x})N$, $0.35 \leq x \leq 0.55$.

3. The coated cutting tool according to claim 1, wherein the peak in an averaged radial intensity distribution profile has its maximum within a scattering vector range of from 3.4 to 3.8 $nm^{-1}$.

4. The coated cutting tool according to claim 1, wherein the full width half maximum (FWHM) of the peak is from 1.0 to 1.8 $nm^{-1}$.

5. The coated cutting tool according to claim 1, wherein the Ti:Al ratio of the sub-layer having the lowest Ti:Al ratio is from 0.10:0.90 to 0.50:0.50, and the Ti:Al ratio of the sub-layer having the highest Ti:Al ratio is from 0.30:0.70 to 0.70:0.30.

6. The coated cutting tool according to claim 1, wherein a thickness of the (Ti,Al)N layer is from 0.4 to 20 μm.

7. The coated cutting tool according to claim 1, wherein the (Ti,Al)N layer has a thermal conductivity of from 2.5 to 4.0 W/mK.

8. The coated cutting tool according to claim 1, wherein the (Ti,Al)N layer has a Vickers hardness of from 2600 to 3700 HV.

9. The coated cutting tool according to claim 1, wherein the (Ti,Al)N layer has a reduced Young's modulus of from 350 to 470 GPa.

10. The coated cutting tool according to claim 1, wherein a thickness of the coating as a whole is from 1 to 25 μm.

11. The coated cutting tool according to claim 1, wherein there is a grain boundary phase present between (Ti,Al)N grains in the (Ti,Al)N layer.

12. The coated cutting tool according to claim 11, wherein the grain boundary phase has a hexagonal crystal structure.

13. The coated cutting tool according to claim 11, wherein the grain boundary phase has an average thickness of from 1 to 5 nm.

14. The coated cutting tool according to claim 1, wherein the diffraction signal giving the peak results from a hexagonal crystal structure.

15. The coated cutting tool according to claim 1, wherein the (Ti,Al)N layer shows a pattern in electron diffraction analysis, which includes diffraction signals from lattice planes of a cubic crystal structure, the lattice planes of the cubic crystal structure being at least one of (111), (200), (220) or (222) lattice planes.

16. The coated cutting tool according to claim 15, further comprising cubic (111) lattice planes in the (Ti,Al)N layer, the (111) lattice planes having a preferred orientation within 40 degrees+/−15 degrees from a direction perpendicular to the coating surface.

17. The coated cutting tool according to claim 1, wherein the substrate is selected from cemented carbide, cermet, cBN, ceramics, PCD and HSS.

* * * * *